(12) United States Patent
Dhong et al.

(10) Patent No.: US 8,464,130 B2
(45) Date of Patent: Jun. 11, 2013

(54) MEMORY DEVICE AND METHOD THEREOF

(75) Inventors: Sang Dhong, San Jose, CA (US); Jin Cho, Palo Alto, CA (US); John Wuu, Fort Collins, CO (US); Gurupada Mandal, San Jose, CA (US)

(73) Assignee: GLOBALFOUNDRIES Inc.

( * ) Notice: Subject to any disclaimer, the term of this patent is extended or adjusted under 35 U.S.C. 154(b) by 1195 days.

(21) Appl. No.: 12/330,012

(22) Filed: Dec. 8, 2008

(65) Prior Publication Data

US 2010/0146330 A1    Jun. 10, 2010

(51) Int. Cl.
*G06F 11/00* (2006.01)

(52) U.S. Cl.
USPC .............................. 714/763; 714/752; 714/746

(58) Field of Classification Search
USPC .................. 714/764–766, 768, 799, 6.14, 42, 714/48
See application file for complete search history.

(56) References Cited

U.S. PATENT DOCUMENTS

| | | | | |
|---|---|---|---|---|
| 5,500,601 | A * | 3/1996 | Lisart et al. | 324/713 |
| 7,689,894 | B2 * | 3/2010 | Hsueh | 714/785 |
| 8,069,377 | B2 * | 11/2011 | Singh | 714/711 |
| 2001/0044922 | A1 * | 11/2001 | La Rosa | 714/800 |
| 2007/0162826 | A1 * | 7/2007 | Major et al. | 714/763 |
| 2007/0189067 | A1 * | 8/2007 | Goodwin | 365/180 |
| 2007/0271495 | A1 * | 11/2007 | Shaeffer et al. | 714/763 |
| 2008/0109697 | A1 * | 5/2008 | Ho et al. | 714/755 |

* cited by examiner

*Primary Examiner* — Scott Baderman
*Assistant Examiner* — Sarai Butler

(57) ABSTRACT

An error correction module is disclosed whereby two bit cells are used to store a bit of information in a redundant manner so that a redundant error correction module can correct a sporadic data error at one of the two bits.

20 Claims, 6 Drawing Sheets

MEMORY DEVICE AND METHOD THEREOF

BACKGROUND

1. Field of the Disclosure

The present disclosure is related to devices having memory and more particularly to devices using redundant memory.

2. Description of the Related Art

Data errors can occur at memory systems in response to various types of interference at the memory system causing one or more memory bit cells to spontaneously flip to its opposite state in response to a radiation event. The problem of sporadic data errors can be mitigated by using extra memory bits and memory controllers that exploit these bits. For example, extra bits can be used to record parity information, store redundant information, or to store error correcting code information. Parity bits allow the detection of any odd number of wrong bits, but cannot be used to correct errant data. Redundant memory allows for detection of an error at memory bit cells by detecting a difference their storage state. Redundant memory also allows for correction of data in normal memory designs by storing a single bit of information at three or more memory locations and providing the logic state represented at the majority of memory locations as the corrected data. Error correcting codes can detect and correct sporadic data errors at bit cells using special algorithms that use coefficients to encode information in a block of bits that contains sufficient detail to permit the recovery of a one or more bit errors in a memory region. Unlike parity, which uses a single bit to provide protection to eight bits, ECC uses larger groupings to protect multiple bits. One draw back with the use of ECC is that it generally takes many logic stages to correct data errors, thereby resulting in a relatively long latency. Thus, while the use of error correcting codes and redundant data can be used to correct sporadic data errors, the space and complexity of doing so can be costly. Therefore, an efficient way of correcting errant data would be useful.

BRIEF DESCRIPTION OF THE DRAWINGS

The present disclosure may be better understood, and its numerous features and advantages made apparent to those skilled in the art by referencing the accompanying drawings.

DETAILED DESCRIPTION

An error correction module is disclosed whereby two bit cells are used to store a bit of information in a redundant manner so that a redundant error correction module can correct a sporadic data error at one of the two bits. Various embodiments of the present disclosure will be understood with reference to FIGS. 1-9 herein.

Figure 1:
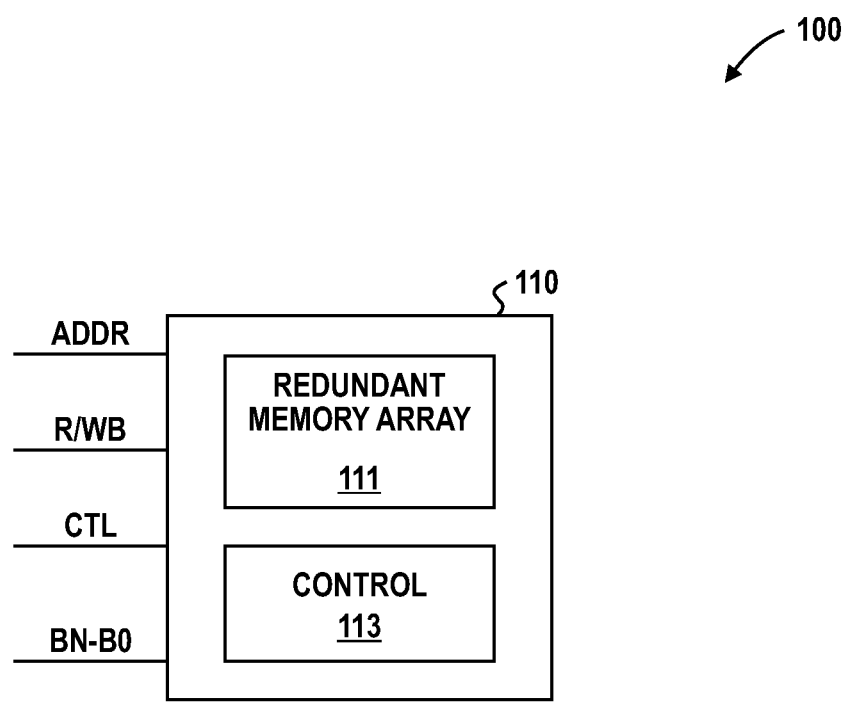
FIG. 1 illustrates a block diagram of a portion of a device in accordance with a specific embodiment of the present disclosure.

FIG. 1 illustrates a memory 110 that is a portion of a device 100. The device 100 can be an integrated circuit, or a device that includes an integrated circuit. The memory 110 of device 100 is connected to: an interconnect labeled ADDR to receive an address signal, also referred to herein as ADDR, that indicates a specific portion of the memory 110 to be accessed; an interconnect labeled R/WB to receive an indicator signal, also referred to herein as R/WB, that indicates whether or not a memory access is a read access or a write access; and to an interconnect labeled CTL to receive control signals, also referred to as CTL, used to access memory 110. In response to the signals ADDR, R/WB, and CTL, information is received from BN-B0 at memory 110 during a write cycle, and information is provide to BN-B0 from memory 110 during a read cycle.

Memory 110 includes a redundant memory array 111, and a control module 113. The control module 113 accesses redundant memory array 111 based upon signals ADDR, R/WB/ and CTL. During a write operation, the control module 113 will store information provided at interconnect BN-B0 at two locations of redundant memory array 111, while during a read operation the control module 113 will provide information stored at redundant memory array 111 to the interconnect BN-B0.

The redundant memory array 111 includes a plurality of bit cells that have unidirectional fail characteristics. A bit cell with a unidirectional fail characteristic can spontaneously flip from a first program state to a second program state in response to a particle strike, but will not flip in the opposite direction. For example, a bit cell that is programmed in a first state, such as a non-conductive state relative to its conductive state, can be sensitive to particle radiation in that the particle radiation can cause the bit cell to transition from its non-conductive state to its conductive state, thereby causing a stored data error. However, when the bit cell is programmed to its conductive state, it will not spontaneously transition from its conductive state to its non-conductive state in response to particle radiation. One example of a bit cell that has a unidirectional fail characteristic is a thyristor-based bit cell commonly referred to as a TRAM cell. The redundant memory array 111 is accessed by control 113 in such a manner that two bit cells, referred to as redundant bit cells, are accessed for each bit of information written to or read from memory 110.

Figure 2:
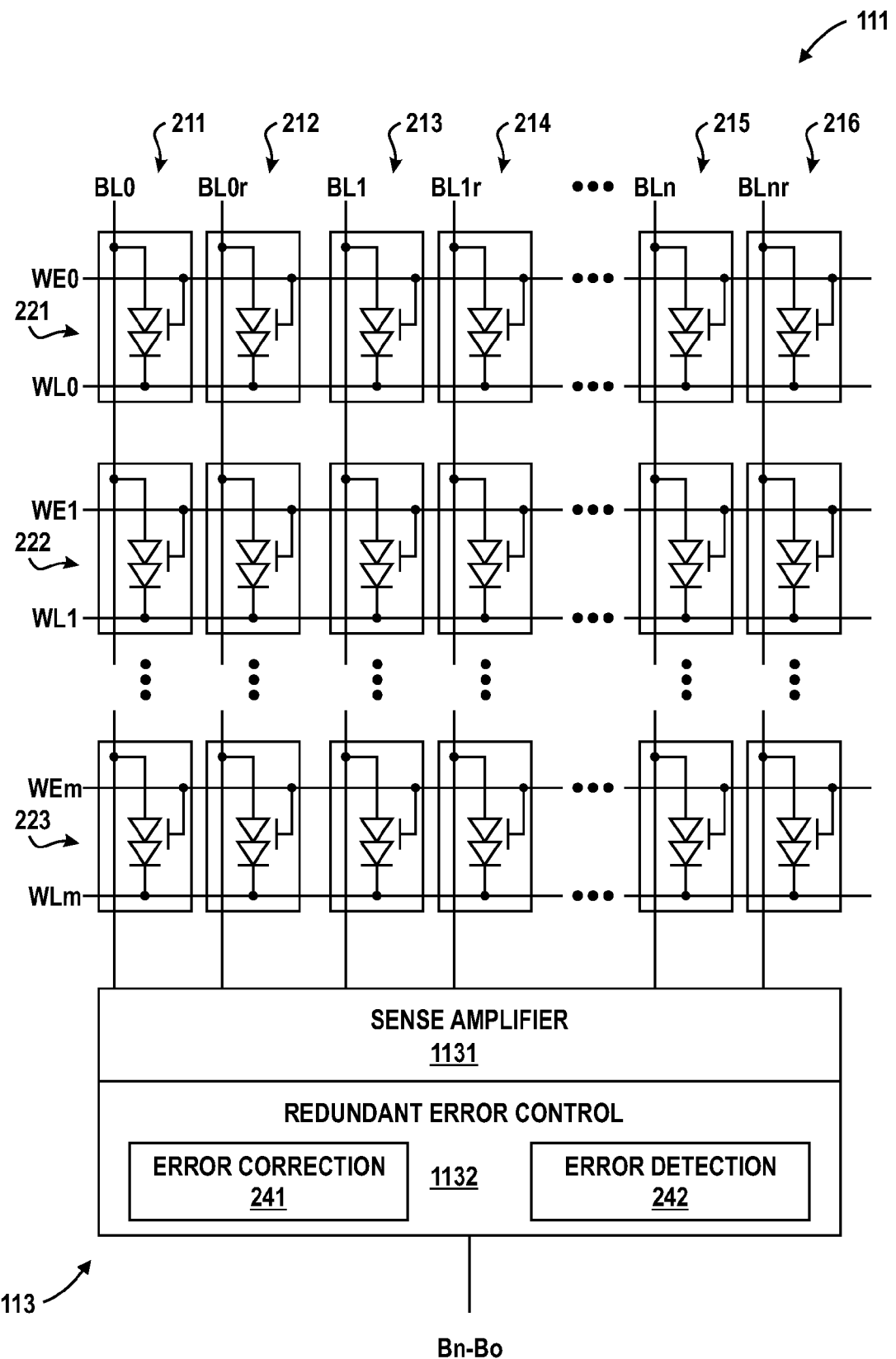
FIG. 2 illustrates a block diagram of a portion of the FIG. 1 in greater detail in accordance with a specific embodiment of the present disclosure.

FIG. 2 illustrates various portions of FIG. 1 in greater detail, including redundant memory array 111 and control module 113. Redundant memory array 111 includes a plurality of bit cells disposed at an integrated circuit along rows 221-223 and columns 211-216. Each bit cell of the array 111 is a TRAM cell that includes a thyristor that can be programmed to represent a specific binary logic value by placing the TRAM cell in a conductive or non-conductive state during a write cycle, where an impedance of the thyristor at the conductive state is lower than an impedance of the thyristor at the non-conductive state. Each thyristor of a bit cell has a gate electrode connected to a corresponding write enable line, an anode connected to a corresponding bit line, and a cathode connected to a corresponding word line. For example, the thyristor associated with the bit cell at column 211 and row 221 has its gate connected to interconnect WE0, its anode connected to BL0, and its cathode connected to WL0. Note that signal are provide to the write enable lines and the word lines from control module 113 based upon the signal ADDR, and the signals R/WB and CTL.

Figure 3:
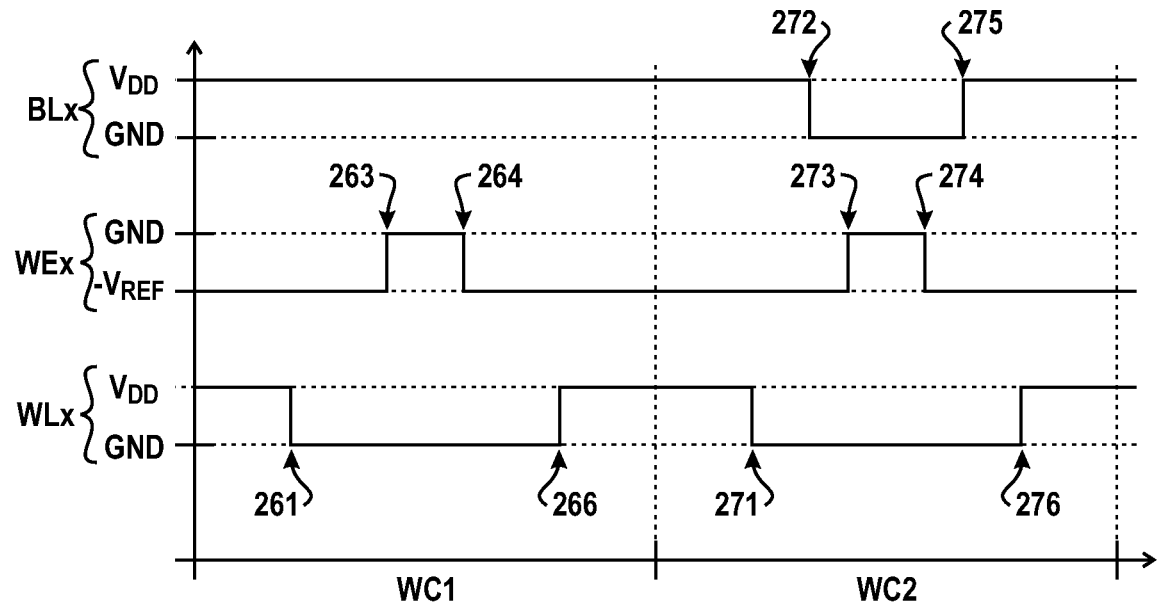
FIG. 3 illustrates a timing diagram of a write cycle of a bit cell of FIG. 2.

FIG. 3 illustrates a timing diagram of write cycles WC1 and WC2 used place a TRAM cell in either a conductive or non-conductive state. For example, the TRAM cell of FIG. 2 that is common to column 211 and row 221, also referred to as TRAM 211/221, or bit cell 211/221, is placed in a conductive state during write cycle WC1 as follows: at the beginning of write cycle WC1 the bit line signal BL0 and the word line signal WL0 are driven to a high voltage level, such as to Vdd, and the write enable signal WE0 is driven to a low voltage level −Vref, such as −0.5 volts; at time 261 signal WL0 is driven to a low voltage level, such as ground; at time 263 signal WE0 is driven to a high voltage level relative −Vref, such as ground, until time 264 when it returns to its low voltage level −Vref, at time 266 signal WL0 is driven back to the high voltage level. In response to write cycle WC1, the thyristor of memory cell 211/221 is placed in a conductive state. TRAM 211/221 is placed in a non-conductive state during write cycle WC2 as follows: at the beginning of write cycle WC2 the bit line signal BL0, the word line signal WL0, and the write enable signal WL0 are driven in the same manner as at the beginning of write cycle WC1; at time 271 signal WL0 is driven to a low voltage level; at time 272 bit line BL0 is driven to a low voltage level, such as ground; at time 273 signal WE0 is driven to its high voltage level until time 274 when it returns to its low voltage level; at time 275, bit line BL0 is driven back to a high voltage level; at time 266 word line signal WL0 is driven back to the high voltage level. In response to write cycle WC2, the thyristor of memory cell 211/221 is placed in a non-conductive state.

During a write operation, the control module 113 writes each bit of received information Bn-B0 at two bit cells of the array 111 based upon the received address ADDR. Referring to FIG. 2, for example, bit cell 211/221 and bit cell 212/221 are redundant bit cells that would both be written to the same program state to represent a single bit of information. Similarly, during a read operation both bit cell 211/221 and bit cell 212/221 will be accessed to provide signals to sense amplifier 1131 for sense amplifier decoding, whereby two binary logic level signals will be provided to redundant error control module 1132 for further processing.

At redundant error control module 1132, error detection module 242 detects whether an errant binary logic level signal is stored at one of the redundant bit cells based upon the binary logic level signals provided by the sense amplifier 1131 during a read access, and the error correction module can provide corrected data in response to a data error at one of the redundant bits.

Figure 4:
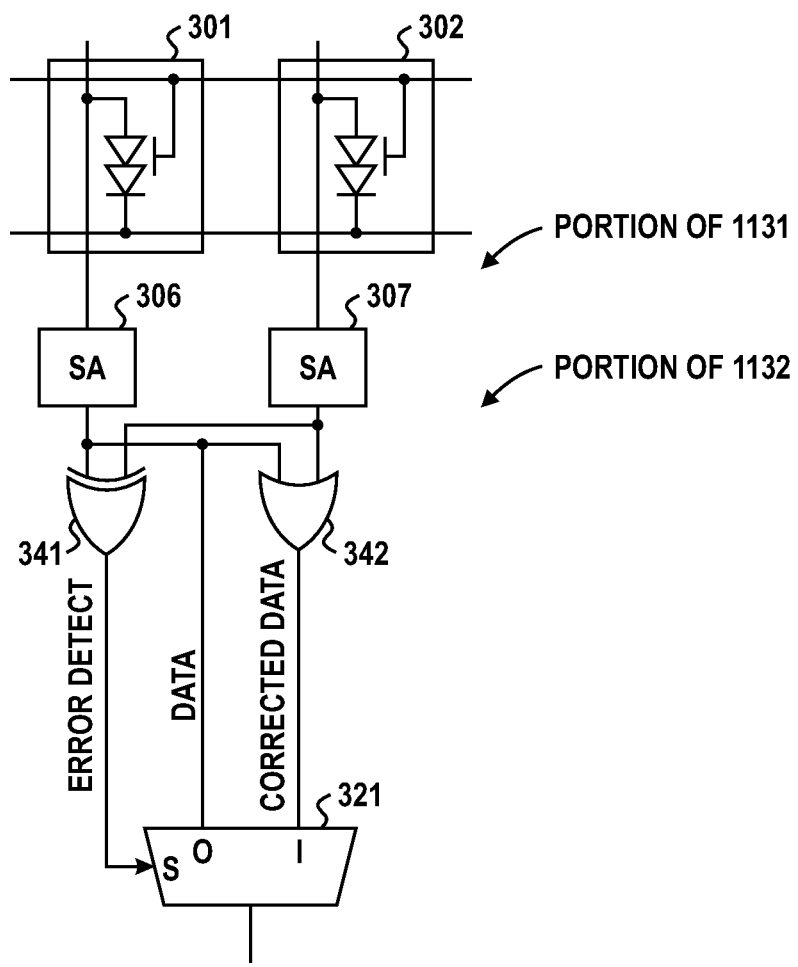
FIG. 4 illustrates a block diagram of a portion of FIG. 2 in accordance with a specific embodiment of the present disclosure.

FIG. 4 illustrates portions of the memory 110 in greater detail. Specifically, FIG. 4 illustrates redundant bit cells 301 and 302, a sense amplifier 306 connected to bit cell 301, a sense amplifier 307 connected to the bit cell 302, an error correction module 342, an error detection module 341, and a multiplexer 321 to provide either the data signal received from sense amplifier 306 or the corrected data from data correction module 342 at its output.

During a read operation, the binary logic values sensed by sense amplifier 306 and 307, which are based upon the conductive states of bit cells 301 and 302, respectively, are provided to the error correction module 342. In accordance with a specific embodiment, the sense amplifiers herein provide a binary logic level high value, e.g. a "logical 1", in response to a bit cell being in a non-conductive state, such as when its corresponding thyristor is turned off. Therefore, a sense amplifier associated with a specific bit cell, such as sense amplifier 306 for bit cell 301, will provide a logical 1 in response to the thyristor associated with the selected bit cell's thyristor being turned off. As a result, the OR-gate 342, which represents the error correction module, will receive logic level high signals at both of its inputs in response to the redundant bit cells maintaining their non-conductive programmed state, and thereby provide a corrected data signal at the output of module 342 that is the same as the data signal provided to both of its inputs. Note that in the illustrated embodiment, a non-conducting thyristor is considered to be a logic level high signal, e.g., a "logical 1", however, in an alternate embodiment, a non-conducting thyristor can be considered a logic level low signal, i.e., a "logical 0" and a conducting thyristor considered a logical "1". So in such an embodiment, the output of the multiplexer 321 can be inverted.

In the event a radiation event has caused one of the bit cells 301 or 302 to transition to flip to its conductive state instead of its programmed non-conductive state, one of the binary logic level signals from sense amplifiers 306 and 307 will have the opposite binary logic level representing an errant binary logic value. For example, should a radiation event cause bit cell 301 to flip, the sense amplifier 306 would detect that the thyristor of bit cell 301 is turned on, e.g., more conductive that when it is turned off, and provide a logical 0 to OR-gate 342, while the sense amplifier 307 continues to provide a binary 1 to OR-gate 342. However, because TRAMs have a unidirectional fail characteristic, it is possible to provide corrected data using only the information stored at bit cells 301 and 302. In other words, if either of the bit cells 301 and 302 is in a conductive state while its corresponding redundant bit cell is in a non-conductive state it is known that an error event has occurred, and the corrected data provided by error correction module 342 is to be used. The error detection module 341 represented by the exclusive OR gate detects the presence of an error condition, and can be used to select the corrected data from error correction module 342.

Figure 5:
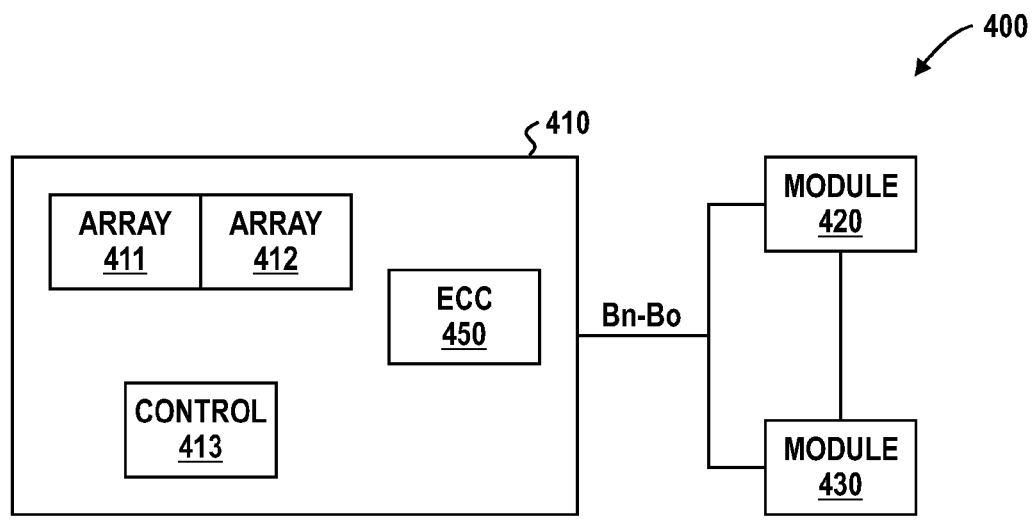
FIG. 5 illustrates a block diagram of a portion of a device in accordance with a specific embodiment of the present disclosure.

FIG. 5 illustrates a memory 410, which represents a specific embodiment of memory 110 of FIG. 1 in greater detail. Memory 410 is connected to modules 420 and 430. Each of memory 410 and modules 420 and 430 can be disposed at a common integrated circuit. The memory 410 represents a specific embodiment of the memory 110 of FIG. 1 that can be accessed by the modules 420 and 430. For example, modules 420 and 430 can represent one or more data processors, such as instruction-based data processors, that can access information from memory 410. Memory 410 includes redundant memory arrays 411 and 412, control module 413, and error correcting code module 450. The control module 413 includes the sense amplifiers and redundant error control modules as previously described, to store each bit of information at two bit cells, one bit cell at array 411 and one bit cell at array 412. By keeping the redundant bits in separate arrays, the likelihood of a single event causing both redundant bits to fail is significantly reduced.

Figure 6:
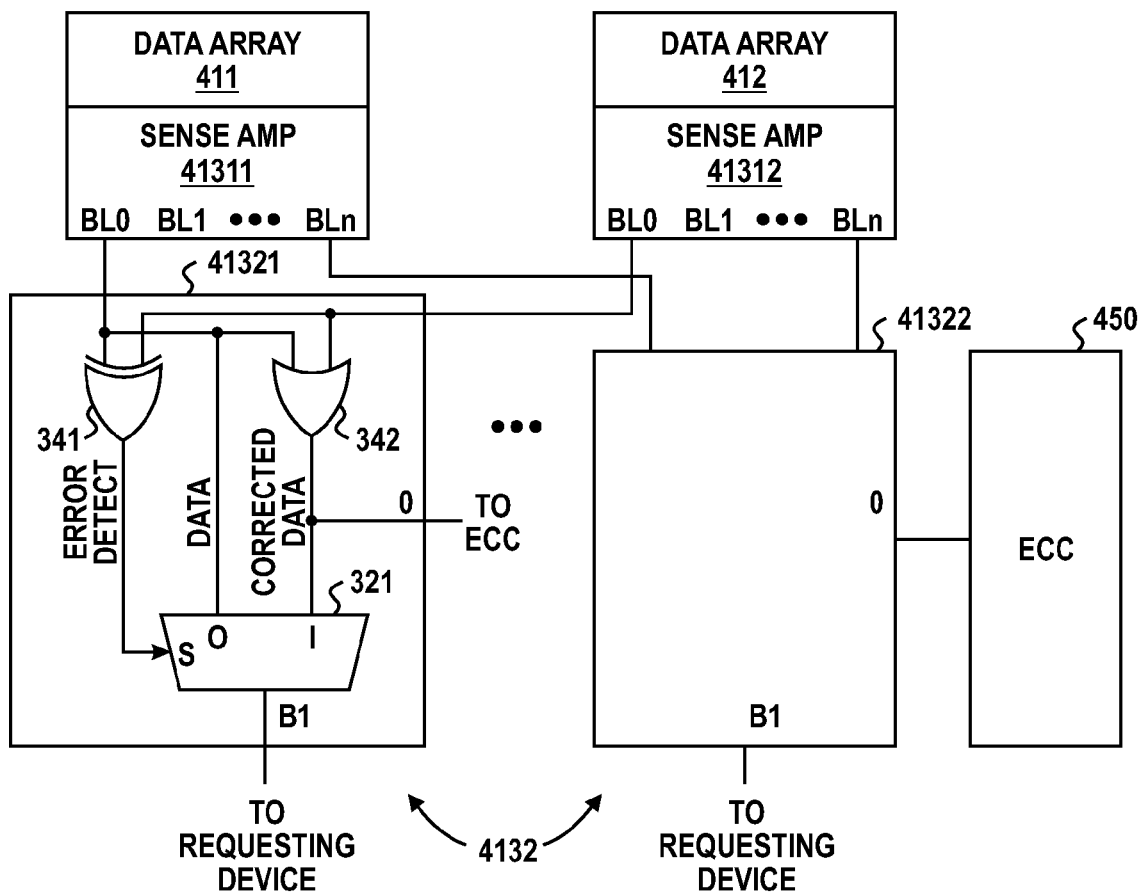
FIG. 6 illustrates a portion of the block diagram of FIG. 5 in greater detail in accordance with a specific embodiment of the present disclosure.

In addition, memory 410 includes an error correcting code (ECC) module 450 that further determines whether or not an error has occurred based upon the redundancy corrected data, thereby allowing for double-bit error correction that can detect when both redundant bits fail FIG. 6 illustrates memory 410 in greater detail and includes sense amplifiers 41311 and 41312, which are portions of control module 413, and redundant error correction portions 41321 and 41322, also portions of control module 413, which correspond to the portion of 1132 as previously described at FIG. 4. The corrected data results of from error correction portions 41321 and 41322 are provided to ECC 450 for further error correction as necessary. In accordance with one embodiment, the error code correction module can use special algorithms that use coefficients to detect multi-bit errors, since the likelihood of a single bit error has been greatly reduced as a result of the redundant bit data that has been used to correct initially read values. If an error is found by the error correction code module 412, appropriate control signals can be provided to the modules 420 and 430 to cancel any operations started using the corrected data, and corrected data can be provided.

Figure 7:
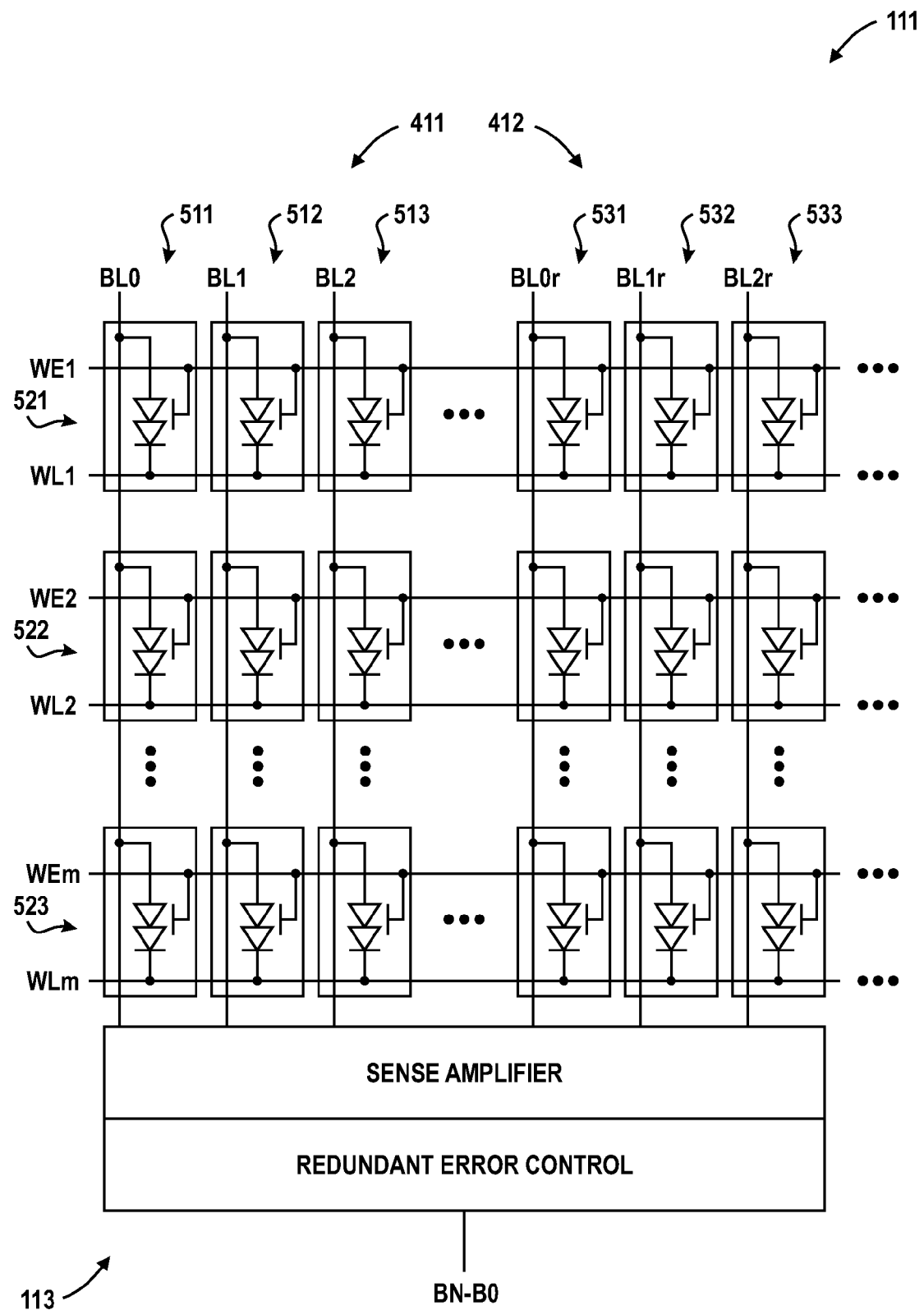
FIG. 7 illustrates a portion of the block diagram of FIG. 6 in greater detail in accordance with a specific embodiment of the present disclosure.

FIG. 7 illustrates arrays 411 and 412 of FIG. 6 in greater detail, whereby bit cells are aligned along rows 521-523 and columns 511-513 and 531-533. Note that the arrays 411 and 412 do not necessarily need to share write enable lines and word lines as illustrated at FIG. 7. Not that redundant bit cells, such as bit cell 511/521 and bit cell 531/521 are not immediately adjacent to each other, thereby reducing the likelihood that a single radiation event, such as a particle, will cause an error at both redundant bit cells.

Figure 8:
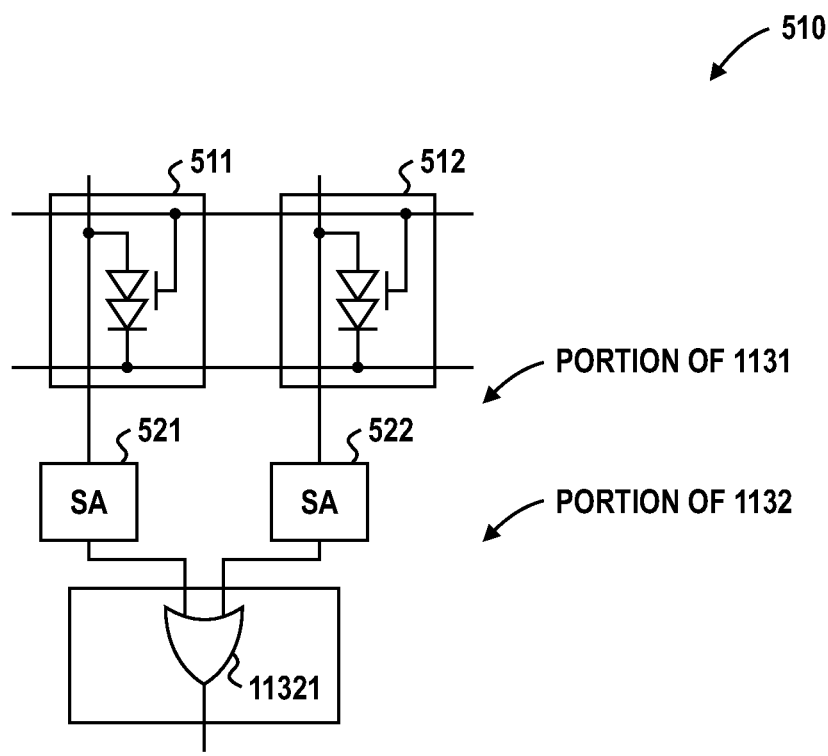
FIG. 8 illustrates an error correction portion of a device in accordance with a specific embodiment of the present disclosure.

FIG. 8 illustrates a memory 510 that represents an alternate embodiment of memory 110 of FIG. 1. Memory 510 includes bit cells 511 and 512 and sense amplifiers 521 and 522 as previously described, however, the error correction module at portion 1132 includes only the OR gate 1133. In this manner, each address accessed during a read operation results in two separate bit cells being read and their logic values provided to the error correction module 1133 for decoding. In the embodiment illustrated, error detection is not used and every logic value provided by control portion 1132 is based upon the logic value received from the two redundant bit cells.

Figure 9:
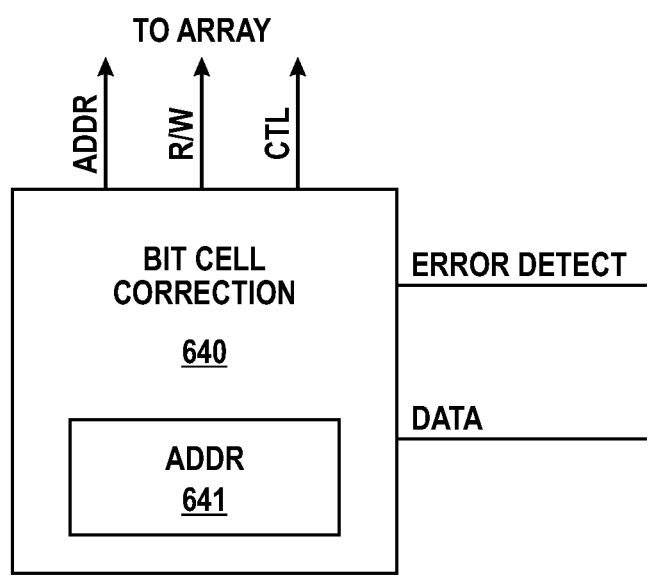
FIG. 9 illustrates an error correction portion of a device in accordance with a specific embodiment of the present disclosure.

FIG. 9 illustrates a bit cell correction module that can be a portion of the control module 113 to correct a detected data error at one of the redundant bit cells by re-writing data to the redundant bit cells. For example, during operation when the ERROR DETECT signal is asserted in response to a mismatch occurring between the logic values read from the redundant bit cells, the bit cell correction module 640 will perform a write operation at the bit cells where the error occurred, as identified by the address saved location 641, to a non-conductive state. Note that the bit cell correction module can write both bit cells to place them in the non-conductive state, and does not need to know which one of the two redundant bit cells was conductive, thereby causing a data error.

In the foregoing specification, principles of the disclosure have been described above in connection with specific embodiments. However, one of ordinary skill in the art appreciates that one or more modifications or one or more other changes can be made to any one or more of the embodiments without departing from the scope of the invention as set forth in the claims below. For example, it will be appreciated that bit cells other than TRAM bit cell can be used, so long as they have a unidirectional fail characteristic. While the bit cells have been described with respect to being in an array configuration, it will be appreciated that other layout configurations are anticipated. For example, the memory arrays can have column interleaving, or not have column interleaving. It will be appreciated for certain memory technologies, the ability to use column interleaving can be limited, whereby the disclosed redundancy can be beneficial, as the use of error correction code techniques typically count on bit cell separation to avoid double bit errors. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A device comprising:
    a first bit cell having a unidirectional fail characteristic;
    a second bit cell having a unidirectional fail characteristic; and
    an error correction module coupled to the first bit cell and to the second bit cell to provide corrected data using only information at the first bit cell and the second bit cell in response to a binary logic value stored at the first bit cell not matching a binary logic value stored at the second bit cell.

2. The device of claim 1 wherein the first bit cell and the second bit cell are disposed at an integrated circuit.

3. The device of claim 2, wherein a third bit cell is disposed between the first bit cell and the second bit cell.

4. The device of claim 2, wherein a plurality of bit cells are disposed between the first bit cell and the second bit cell.

5. The device of claim 2, wherein the first bit cell includes a first thyristor and the second bit cell includes a second thyristor.

6. The device of claim 1 further comprising an error detection module coupled to the first bit cell and to the second bit cell to detect a data error at one of the first bit cell and the second bit cell using only the information at the first bit cell and the second bit cell.

7. The device of claim 6 further comprising:
    an error correction code module comprising a first input coupled to the error correction module to receive the corrected data.

8. The device of claim 7 wherein the error correction module, the error correction code module, the first bit cell and the second bit cell are disposed at an integrated circuit.

9. The device of claim 8, wherein a third bit cell is disposed between the first bit cell and the second bit cell.

10. The device of claim 9, wherein the first bit cell includes a first thyristor and the second bit cell includes a second thyristor.

11. The device of claim 1 further comprising:
    an error correction code module comprising a first input coupled to the error correction module to receive the corrected data.

12. A method comprising: reading a binary logic value stored at a first bit cell having a unidirectional fail characteristic; reading a binary logic value stored at a second bit cell having a unidirectional fail characteristic; and determining a corrected binary logic value in response to the binary logic value stored at the first bit cell not matching the binary logic value stored at the second bit cell, where the corrected binary logic value is determined by only using the binary logic value stored at the first bit cell and the binary logic value stored at the second bit cell.

13. The method of claim 12 further comprising:
    writing the binary logic value at the first bit cell by placing the first bit cell in a first conductive state prior to reading the binary logic value stored at the first bit cell;

writing the binary logic value at the second bit cell by placing the second bit cell in the first conductive state prior to reading the binary logic value stored at the first bit cell;

providing the first binary logic value in response to reading the first bit cell when the first and second bit cells are in the first conductive state; and wherein determining a corrected binary logic value further comprises providing the first binary logic value in response to reading the first bit cell when the first bit cell is in the first conductive state and the second bit cell is in a second conductive state.

14. The method of claim 13, wherein reading a binary logic value at the first bit cell comprises reading a first logic value in response to the first bit cell being at a first conductive state, and reading a second logic value in response to the first bit cell being at a second conductive state, where an impedance of the first bit cell at the first conductive state is lower than an impedance of the first bit cell at the second conductive state.

15. The method of claim 12 further comprising:
determining an error has occurred at information stored at one of the first bit cell and the second bit cell; and wherein
determining the corrected binary logic value occurs in response to determining the error has occurred.

16. The method of claim 12 wherein
correcting further comprises providing a first binary logic value in response to reading the first bit cell when the first bit cell and the second bit cell store different binary logic values.

17. The method of claim 16, wherein the first binary logic value is associated with bit cells at a first conductive state, and a second binary logic value is associated with bit cells at a second conductive state, where an impedance of the bit cell at the first conductive state is lower than an impedance of the bit cells at the second conductive state.

18. The method of claim 12, further comprising:
providing the corrected binary logic value to an error correction code module for error checking.

19. The method of 12, wherein reading the binary logic value stored at the first bit cell further comprises the first and second thyristors being disposed at respective first and second locations of an integrated circuit that are not adjacent to each other.

20. A memory device comprising:
a first bit cell comprising a first thyristor and having a unidirectional fail characteristic, and a second bit cell comprising a second thyristor and having a unidirectional fail characteristic, the first and second bit cells comprising redundant bit cells configured to receive and store a same logic value; an OR gate having a first input to receive a first logic level representative of a logic value stored in the first bit cell, a second input to receive a second logic level representative of a logic value stored in the second bit cell, and an output; an XOR gate having a first input to receive the first logic level, a second input to receive the second logic level, and an output; and
a multiplexer having a first input coupled to the output of the OR gate, a second input to receive the first logic level, a select input coupled to the output of the XOR gate, and an output to provide one of the first logic level or a logic level of the output of the OR gate based on a logic level of the output of the XOR gate.

* * * * *